United States Patent [19]

Ikeda

[11] Patent Number: 5,039,964
[45] Date of Patent: Aug. 13, 1991

[54] INDUCTANCE AND CAPACITANCE NOISE FILTER

[76] Inventor: Takeshi Ikeda, 2-5-6-213, Sanno, Ohta-ku, Tokyo, Japan

[21] Appl. No.: 480,026

[22] Filed: Feb. 14, 1990

[30] Foreign Application Priority Data

Feb. 16, 1989 [JP] Japan ................................... 1-37077
Mar. 11, 1989 [JP] Japan ................................... 1-59241

[51] Int. Cl.⁵ .......................... H03H 7/01; H03H 7/09
[52] U.S. Cl. ..................................... 333/181; 333/185; 336/200
[58] Field of Search ............... 333/181, 184, 185, 177, 333/174, 204, 246; 336/200, 232

[56] References Cited

U.S. PATENT DOCUMENTS

| | | | |
|---|---|---|---|
| 4,253,079 | 2/1981 | Brosh | 336/200 X |
| 4,494,100 | 1/1985 | Stengel et al. | 336/200 |
| 4,614,925 | 9/1986 | Kane | 333/185 X |
| 4,728,911 | 3/1988 | Sjögren | 333/185 X |
| 4,943,793 | 7/1990 | Ngo et al. | 336/232 X |

FOREIGN PATENT DOCUMENTS

| | | | |
|---|---|---|---|
| 0097647 | 8/1977 | Japan . | |
| 0053011 | 3/1987 | Japan | 333/181 |
| 0233911 | 10/1987 | Japan . | |

*Primary Examiner*—Eugene R. Laroche
*Assistant Examiner*—Seung Ham
*Attorney, Agent, or Firm*—Oliff & Berridge

[57] ABSTRACT

A distributed constant type LC noise filter includes a dielectric formed into an insulating plate or cylinder, a first conductor spirally formed on the dielectric at one side to function as an inductor, a second conductor spirally formed on the other side of the dielectric at a location opposite to the first conductor to form a distributed constant type capacitor between the first and second conductors, and a shield conductor located on the dielectric between each adjacent lines in the first conductor to prevent a short-circuit therebetween, whereby noise components in signals on the first conductor can be eliminated without any short-circuit between each adjacent lines in the first conductor.

21 Claims, 17 Drawing Sheets

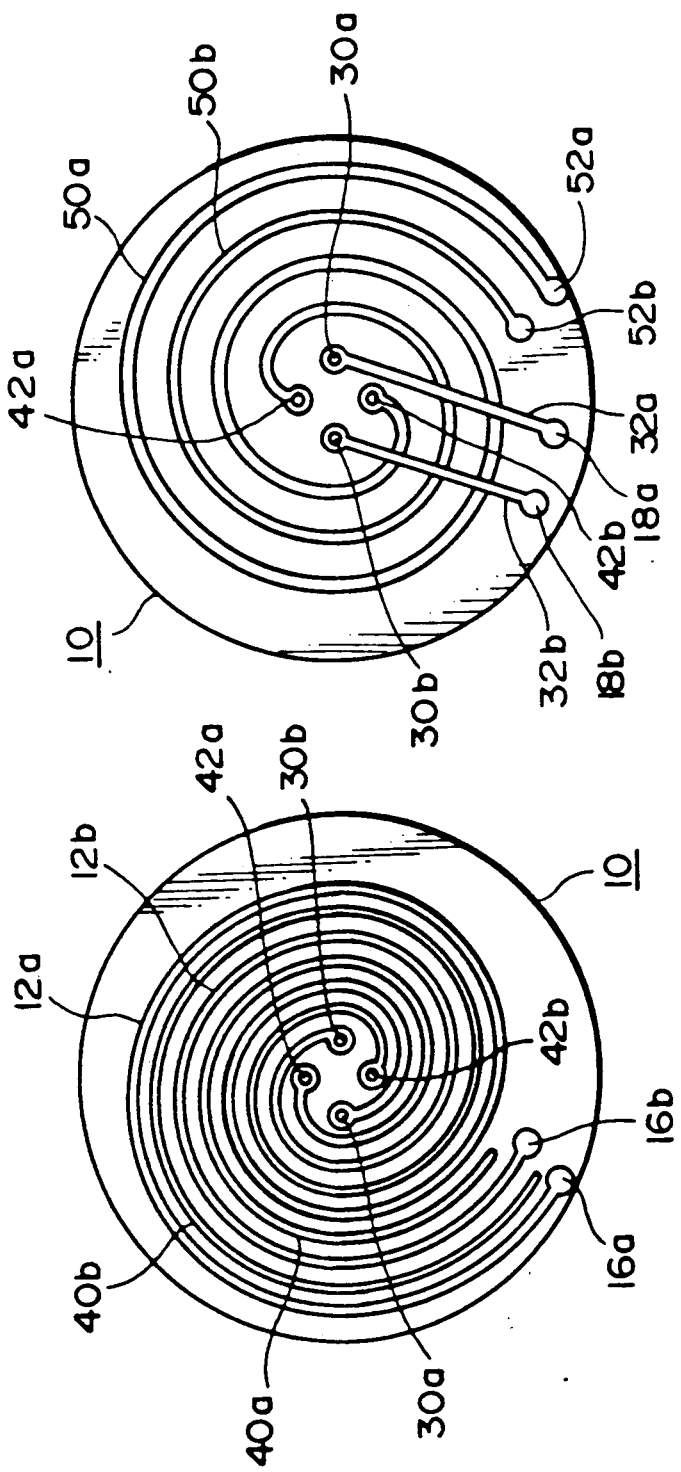

FIG. 12

| | (A) | (B) | (C) | (D) | (E) |
|---|---|---|---|---|---|
| AREA | 180.0 | 96.0 | 150.0 | 96.0 | 96.0 |
| TOP (L) | 410 | 12, 40 | 12, 40 | 12 | 12, 40 |
| AREA | 96.0 | 180.0 | 165.0 | 96.0 | 96.0 |
| BOTTOM (C) | 420 | 420 | 440 | 50 | 50 |
| L (μH) | 0.0143 | 0.172 | 0.173 | 0.20 | 0.20 |
| C (PF) | 243 | 234.5 | 246 | 246 | 246 |

WIDTH : 0.7 mm
GAP : 0.5 mm
LENGTH : 140 mm

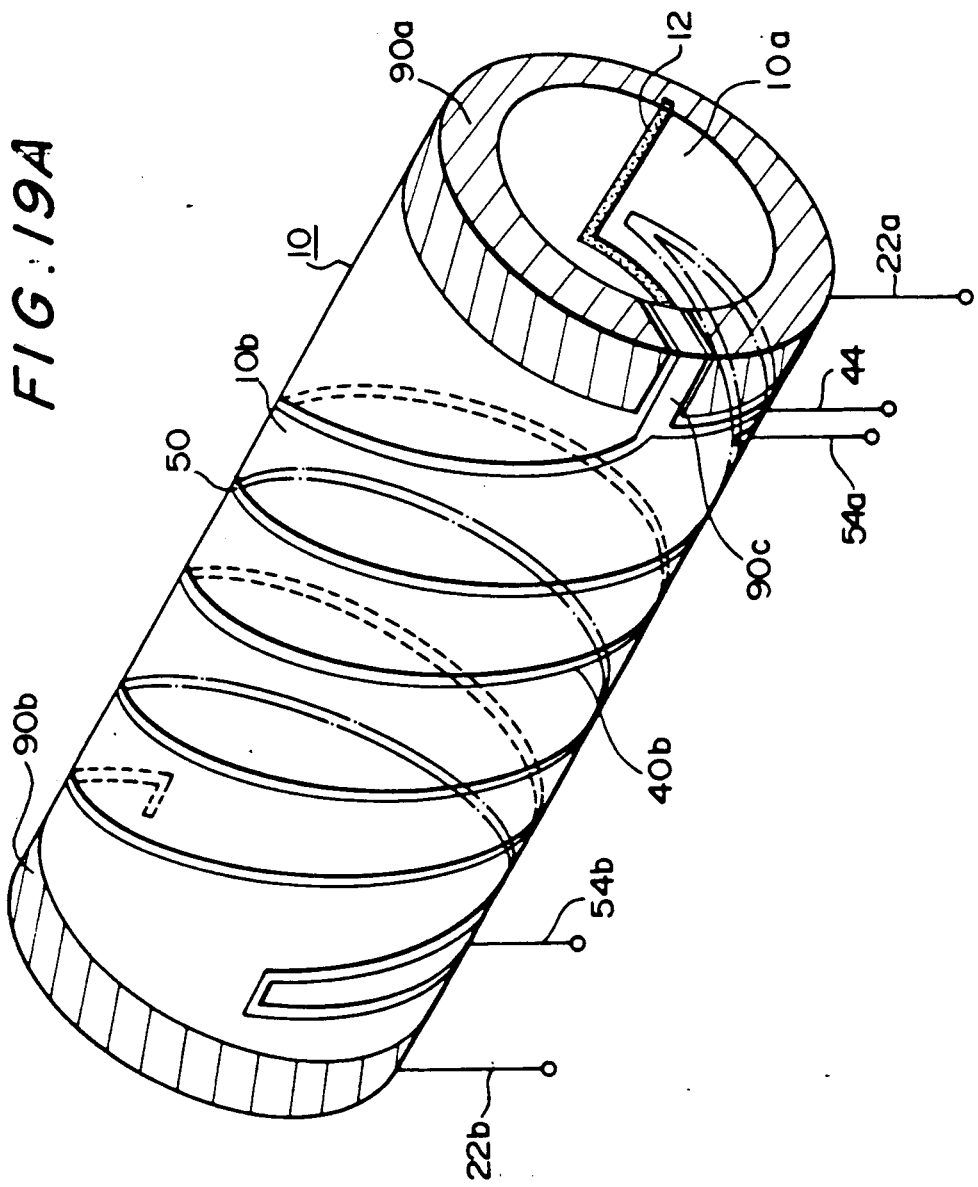

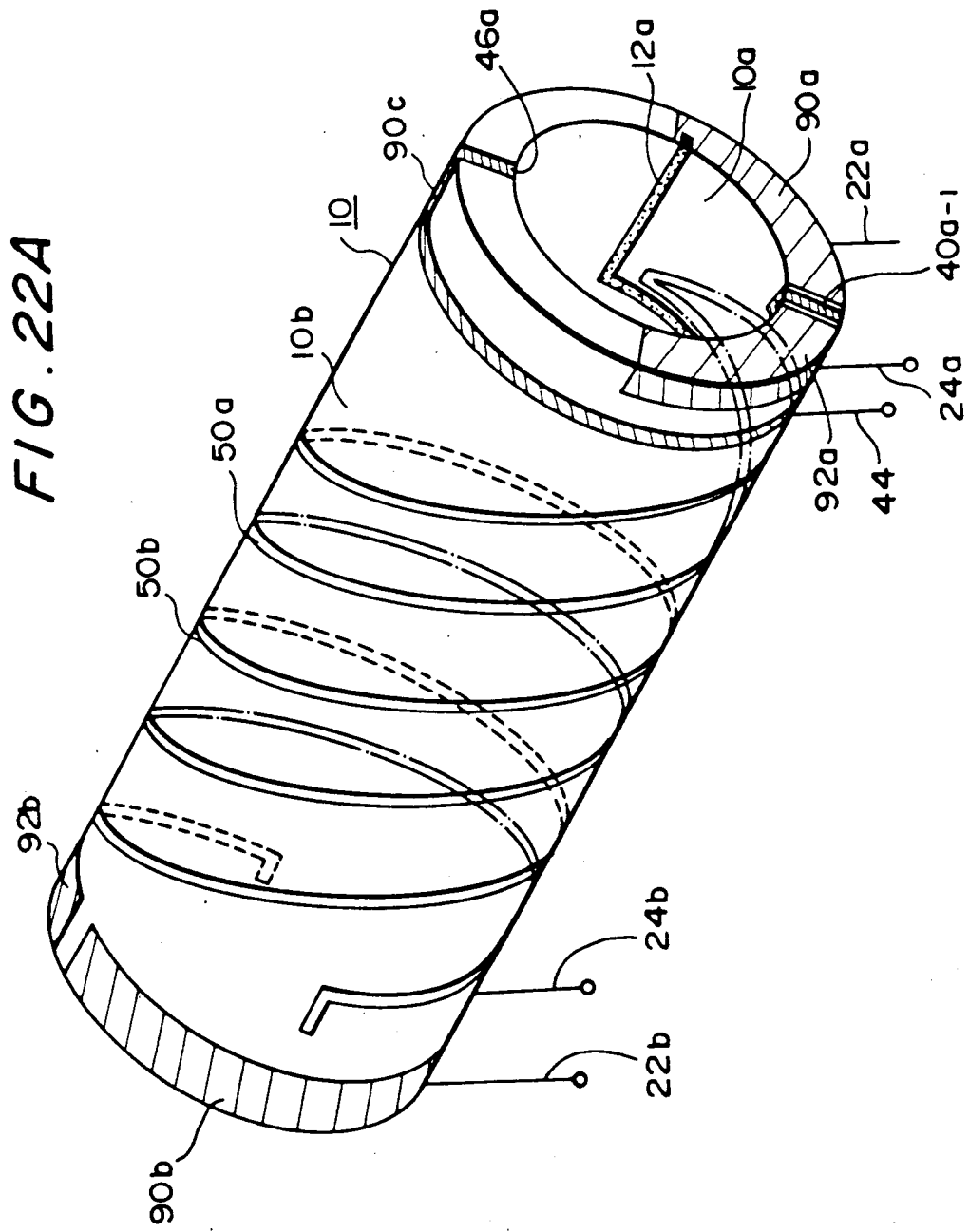

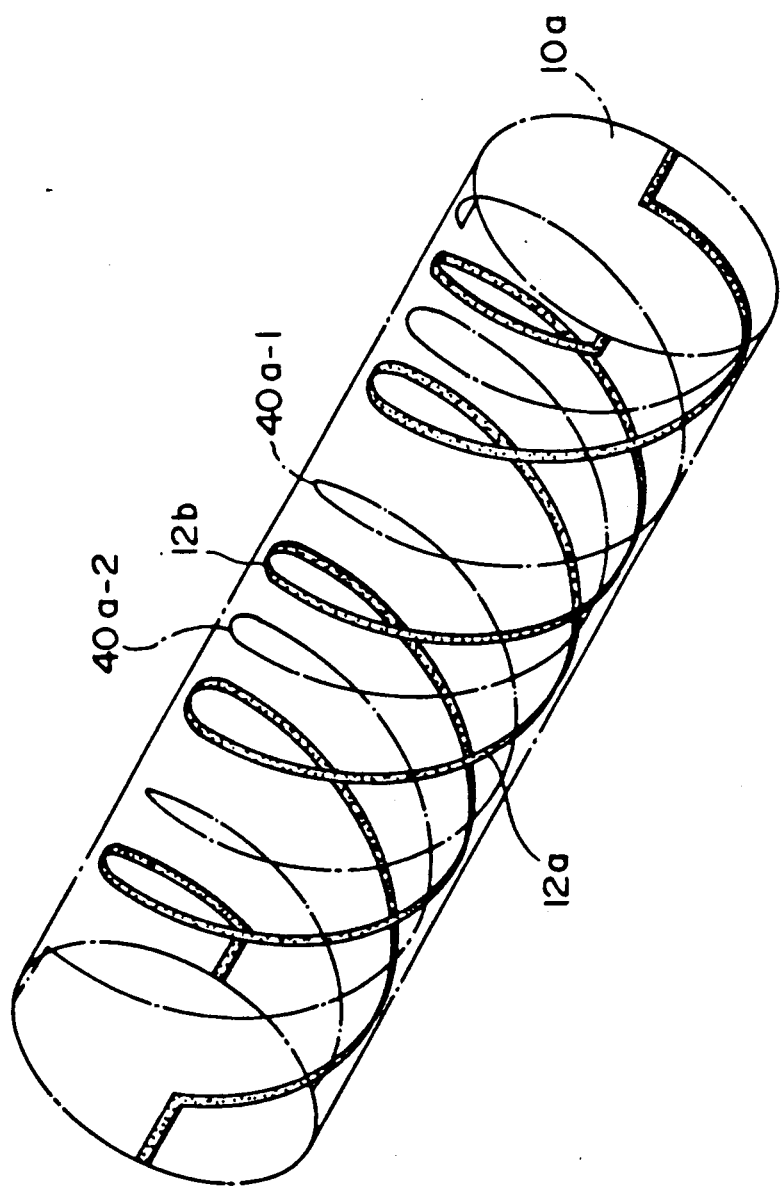

INDUCTANCE AND CAPACITANCE NOISE FILTER

BACKGROUND OF THE INVENTION

1. Field of the Invention:

The present invention relates to a distributed constant type inductance and capacitance noise filter which will be referred to "LC noise filter" hereinafter.

2. Description of the Prior Art:

There is known a noise filter which comprises a first conductor 12 spirally formed on an insulative substrate 10 made of ceramic or the like at one side as shown in FIG. 17A of the accompanying drawings and a ground conductor 14 formed on the same substrate at the other side as shown in FIG. 17B.

As shown in FIG. 18, such a noise filter functions as an LC noise filter wherein the first spiral-shaped conductor 12 provides an inductance (L) while an electrostatic distributed-constant capacitance (C) is provided between the first spiral-shaped conductor 12 and the ground conductor 14.

However, such an LC noise filter constructed according to the prior art has the following problems:

(a) First Problem:

The prior art noise filter causes an eddy current to produce in the ground conductor 14 which is located on the substrate 10 at its bottom face. Therefore, the first spiral-shaped conductor 12 could not provide such sufficient inductance as expected. As a result, the prior art noise filter only functions to provide electrical characteristics resembling those of a capacitor, rather than as an LC noise filter.

In other words, the first spiral-shaped conductor 12 of the prior art LC noise filter is coupled capacitively and also inductively with the ground conductor 14. Therefore, the current passing through the first spiral-shaped conductor 12 creates a magnetic flux which in turn creates an electromotive force in the ground conductor 14. Such an electromotive force causes a short-circuit current to be produce in the ground conductor 14 as shown by double-headed circular line A in FIG. 17B.

If it is assumed that the first spiral-shaped conductor 12 functions a primary coil in a transformer, the ground conductor 14 acts as if a secondary coil in the same transformer. For such a reason, the first spiral-shaped conductor 12 cannot provide such sufficient inductance level as expected.

(b) Second Problem:

This noise filter is adapted to eliminate noises included in signals which are provided in the opposite terminals 16 and 18 of the first conductor 12 functioning as an inductor. If the frequency of such signals is increased, a short-circuit will be created between each adjacent line in the first spirally formed conductor 12, as shown by arrow B. As a result, the first conductor 12 will not function as an inductor.

Such a short-circuit is more frequently created as the frequency of the provided signals is increased. Therefore, the conventional noise filters could not be used as high-frequency noise filters.

SUMMARY OF THE INVENTION

It is therefore an object of the present invention to provide a distributed constant type LC noise filter which is excellent in electric characteristics to overcome the first and second problems in the prior art.

To this end, the present invention provides a distributed constant type LC noise filter comprising a dielectric, a first conductor spirally formed on the dielectric at one side and adapted to function as an inductor, a second conductor spirally formed on the other side of the dielectric at a location opposite to the first conductor to form a distributed constant capacitor between the first and second conductors, and a shield conductor located on the dielectric between each adjacent lines in at least one of the first and second conductors means to prevent a short-circuit between each adjacent lines in that conductor.

BRIEF DESCRIPTION OF THE DRAWINGS

FIGS. 1 through 16 illustrate one preferred embodiment of a plate-like LC noise filter constructed according to the present invention in which a dielectric used is in the form of an insulating substrate.

FIG. 2 is a view showing an equivalent circuit which can be used in the noise filter shown in FIG. 1.

FIGS. 3A and 3B illustrate the top and bottom sides of the substrate in a second embodied example from the LC noise filter constructed according to the present invention.

FIG. 4 is a view showing an equivalent circuit which can be used in the LC noise filter of FIG. 3.

FIG. 5 is a view illustrating an equivalent circuit which can be used in a third embodied example of the present invention.

FIG. 6 illustrating a fourth embodied example of the LC noise filter constructed according to the present invention in which a housing is used.

FIG. 7 is a view illustrating a multi-channel noise filter which includes a plurality of stacked PC boards, one of these PC boards having the noise filters shown in the first to fourth embodied examples.

FIGS. 8 and 9 illustrate layouts in each of the noise filters used to form the multi-channel noise filter shown in FIG. 7.

FIG. 10 is a view showing a PC board including an integrated circuit mounted thereon and also having a multi-channel signal-line noise filter and a power-line noise filter, both of which are formed on the PC board.

FIG. 11 shows a PC board on which a multi-channel noise filter formed on a longitudinally extending insulating substrate is mounted.

FIG. 12 illustrates experimental measurements of attenuation in respect to noise filters constructed according to the prior art and the present invention.

FIGS. 13 to 15 illustrate attenuation characteristics measured by the use of each of the noise filters shown in FIG. 12.

FIG. 16 shows a three-terminal type noise filter which is provided by modifying the noise filter shown by (A) in FIG. 12.

FIGS. 19A through 25 illustrate another preferred embodiment of a cylinder-like LC noise filter constructed according to the present invention in which the dielectric is formed into an insulating cylinder.

FIGS. 19A and 19B illustrate a first embodied example from the second mentioned embodiment of the present invention.

FIGS. 20 and 21 illustrate a modification of the noise filter shown in FIG. 19.

FIGS. 22A and 22B illustrate a second embodied example from the second embodiment of the present invention.

FIG. 23 illustrates a third embodied example from the second embodiment of the present invention.

FIG. 24 illustrates a filter formed to be of SMD type according to the present invention.

FIG. 25 illustrates a multi-channel noise filter constructed according to the present invention.

DETAILED DESCRIPTION OF THE PREFERRED EMBODIMENTS

First Embodiment

First of all, the first preferred embodiment of the present invention will be described to form a plate-like LC noise filter which uses an insulating substrate as dielectric.

The LC noise filter is in the form of a distributed constant type wherein it comprises an insulating substrate, a first conductor spirally formed on the substrate at one side and adapted to function as an inductor, a second conductor spirally formed on the other side of the substrate at a location opposite to the first conductor to form a distributed constant capacitor between the first and second conductors, and a shield conductor located on the dielectric between adjacent lines in the first conductor to prevent a short-circuit between adjacent lines in the first conductor.

Figure 17A:
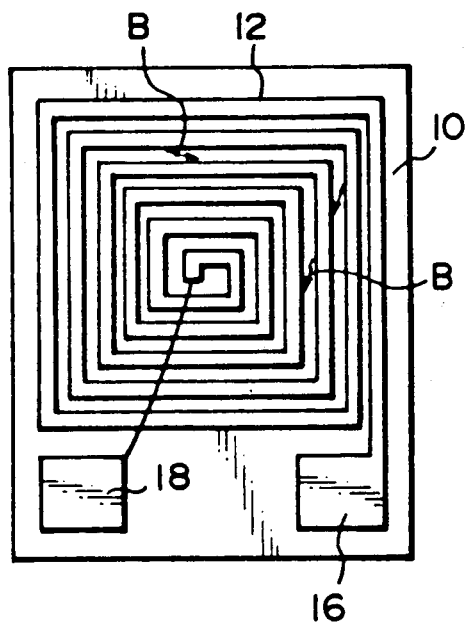
FIGS. 17A and 17B exemplifies one of the conventional noise filters.

The inventors have studied a reason why the first spirally formed conductor 12 in the LC noise filter as shown in FIG. 17 cannot have such a sufficient inductance as expected.

Figure 17B:
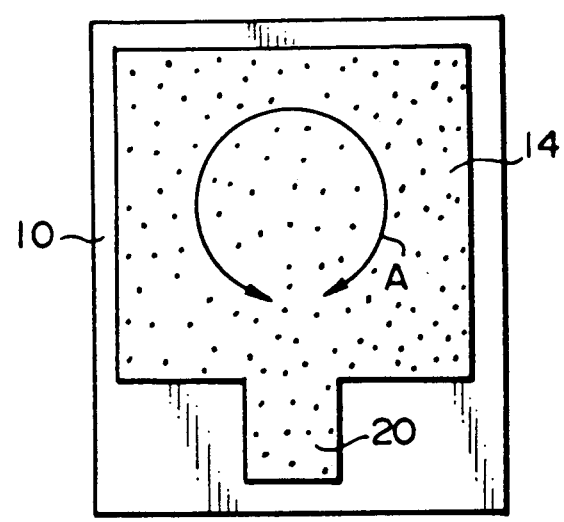
Figure 18:
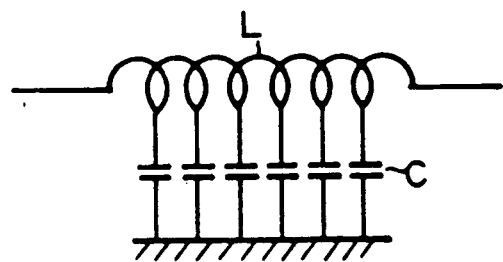
FIG. 18 shows an equivalent circuit which can be used in the noise filter shown in FIG. 17.

The inventors have assumed that one of its primary causes resides in a short-circuit created in the ground conductor 14 as shown by a solid-line circle A in FIG. 17B. Thus, the inventors have formed a noise filter including a comb-like ground conductor through which a short-circuit cannot be easily produced. However, even such a noise filter could not provide satisfactory performances including such a sufficient inductance as expected.

In view of this fact, the inventors have been studying how to provide such a manner that by spirally forming a first conductor as an inductor on a substrate at one side and also spirally forming a second conductor as a capacitor on the same substrate at the other side, an LC noise filter having the desired performance can be provided without reduction of the inductance in the first conductor.

Thus, the inventors also assumed that in order to obtain such an LC noise filter, it might be preferred to form the second conductor such that any magnetic path created when the first spiral-shaped conductor was energized would not be damaged. Based on this assumption, the inventors attempted to form an LC noise filter comprising an insulating substrate, a first conductor spirally formed on the substrate at one side as an inductor, and a second conductor spirally formed on the other side of the substrate at a position opposite to the first conductor to provide a capacitor between the first and second conductors.

Experiments showed that such an LC noise filter had a preferred performance due to which the first spirally formed conductor provided a sufficient inductance.

However, it has been found that such an LC noise filter had a disadvantage in that if the frequency of signals passing through the first inductor conductor was increased, a short-circuit was produced between each adjacent lines in the first conductor to make the latter inoperative.

The inventors have found that when a shield conductor was formed on the insulating substrate between adjacent lines in the first conductor, a short-circuit would not be produced between each adjacent lines in the first conductor even if the frequency of incoming signals was increased. In such a manner, the present invention can provide an LC noise filter which is excellent in electric characteristics from lower frequency region to higher frequency region.

First Embodied Example

Figure 1A:
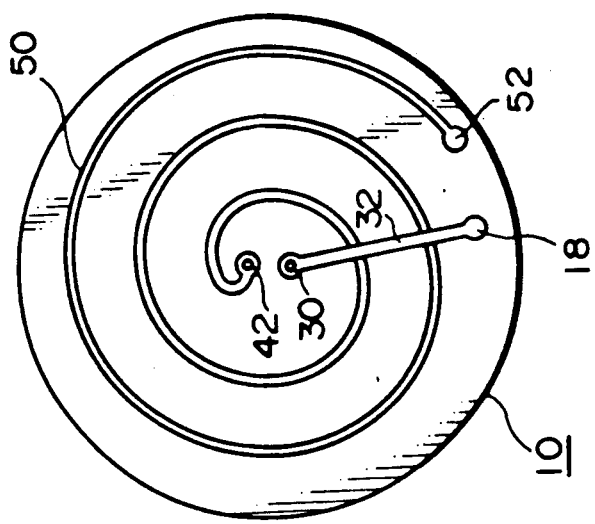
FIGS. 1A and 1B respectively illustrate the top and bottom faces of the substrate in a first embodied example from the first mentioned embodiment of the present invention.

Referring now to FIG. 1, there is shown a distributed constant type LC noise filter which is constructed according to the principle of the present invention. As seen from FIG. 1A, the LC noise filter comprises a first conductor 12 spirally formed on an insulating substrate 10 made of ceramic or the like at one side and functioning as an inductor. The first conductor 12 terminates a terminal 16 at the outer end thereof.

Figure 1B:
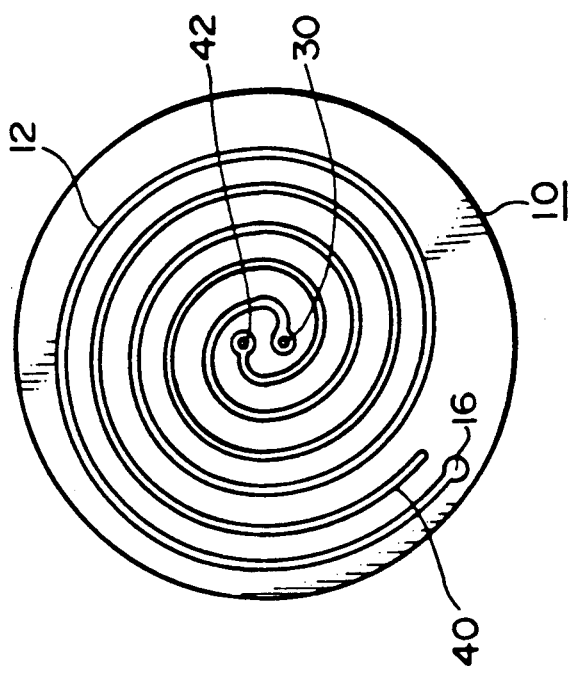

As seen from FIG. 1B, the LC noise filter also comprises a second conductor 50 similarly spirally formed on the other side of the insulating substrate 10 at a position opposite to the first conductor 12. The second conductor 50 is electrostatically capacitive-coupled with the first conductor 12 to form a capacitor therebetween. The second conductor 50 terminates a terminal 52 at the outer end thereof.

As shown in FIG. 1A, the substrate 10 includes a through-hole 30 formed therein at the center thereof. The inner end of the first spiral-shaped conductor 12 is connected with a terminal 18 through a lead 32 on the other side of the substrate 10 via the through-hole, as seen from FIG. 1B.

The first embodied example of the LC noise filter is characterized by a shield conductor 40 that is spirally formed on the substrate 10 between each adjacent lines in the first conductor 12.

The substrate 10 also includes a through-hole 42 formed therein at the central portion thereof. The inner end of the shield conductor 40 is electrically connected with the inner end of the second conductor 50 on the other side of the substrate 10 through the through-hole 42.

Figure 2:
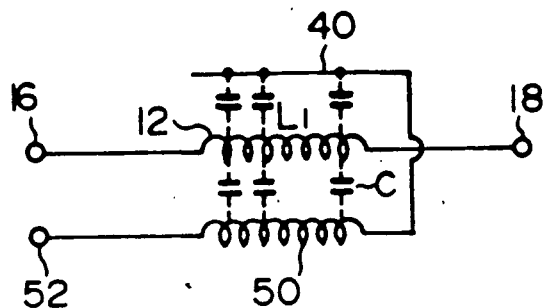

FIG. 2 shows an equivalent circuit which can be used in the LC noise filter in the first embodied example. The equivalent circuit may function as a first inductor L1 in the first spirally formed conductor 12.

Since the first and second conductors (12, 50) are spirally formed on the opposite sides of the substrate 10 at positions opposed to each other, they are electrostatically capacitive-coupled with each other to form a distributed constant capacitor C therebetween.

Thus, the noise filter according to the first embodied example will function a distributed constant type LC noise filter having such a circuit as shown in FIG. 2.

In the noise filter of the present invention, particularly, the second conductor 50 is formed to provide a capacitor between the first and second conductors (12, 50) without preventing any magnetic path in the first conductor 12.

Namely, a magnetic flux created when the first conductor 12 is energized will pass through the substrate 10 from the top to the bottom or vice versa between adjacent lines in the first conductor 12. If the second conductor 50 is formed to interrupt the magnetic path (for example, if the second conductor 50 is provided at a position opposite to the spacing between adjacent lines in the first conductor 12), the magnetic path will be closed by the second conductor 50. This makes the first conductor 12 inoperative as an inductor.

On the contrary, if the second conductor 50 is positioned opposite to the first conductor 12 according to the present invention, the magnetic path in the first conductor 12 will not be interrupted by the second conductor 50. Thus, the first conductor 12 cannot be reduced in inductance. This can provide an LC noise filter having its sufficient performance.

For example, if the terminal 52 of the second conductor 50 is used as a ground terminal while the terminals 16 and 18 of the first conductor 12 are used as input and output terminals, a normal mode type noise filter having its electrical characteristics can be provided according to the present invention.

In accordance with the present invention, furthermore, a normal mode type three-terminal noise filter excellent in electrical characteristics from lower frequency bands to higher frequency bands can be provided by forming the shield conductor 40 to prevent a short-circuit between adjacent lines in the first conductor 12.

In addition, the shield conductor 40 improves not only the inductance in the first conductor 12 but also the capacitance between the first and second conductors (12, 50). As will be apparent later, such an arrangement can provide an excellent attenuation in comparison with the prior art having no shield conductor.

Second Embodied Example

Figure 4:
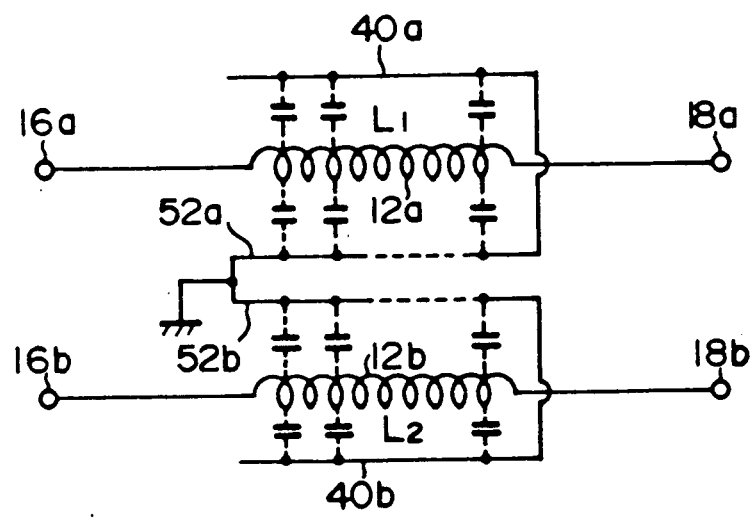

FIG. 3 shows a second embodied example of the present invention in which the LC noise filter comprises a pair of inductor conductors 12a and 12b spirally formed on a substrate 10 at one side as shown in FIG. 3A and a pair of capacitor conductors 50a and 50b similarly spirally formed on the other side of the substrate 10 at positions opposite to the respective inductor conductors 12a and 12b. This can provide a common mode type LC noise filter as shown in FIG. 4.

As best seen from FIG. 3A, the first and second inductor conductors 12a and 12b of the noise filter are spirally formed on the top face of the substrate 10 at positions adjacent to each other. Further, the outer end of each of the inductor conductors 12a and 12b terminates a terminal 16a or 16b.

As shown in FIG. 3B, the other or bottom side of the substrate 10 includes the capacitor conductors 50a and 50b each of which is spirally formed thereon at a position opposite to the corresponding inductor conductor 12a or 12b. Similarly, the outer end of each of the capacitor conductors 50a and 50b terminates a terminal 52a or 52b.

As shown in FIG. 3A, the substrate 10 includes two through-holes 30a and 30b formed therein adjacent to the center thereof. As seen from FIG. 3B, the inner end of each of the inductor conductors 12a and 12b is passed through the corresponding one of the through-holes 30a or 30b and then connected with the corresponding one of the terminals 18a or 18b through one of leads 32a or 32b which are formed on the bottom side of the substrate 10.

According to the present invention, a first shield conductor 40a is spirally formed on the substrate between the inductor conductors 12a and 12b while a second shield conductor 40b is similarly spirally formed on the same substrate between the inductor conductors 12b and 12a. These shield conductors 40a and 40b can provide shield means between the inductor conductors 12a and 12b.

The inner end of each of the shield conductors 40a and 40b is electrically connected with the inner end of the corresponding one of the capacitor conductors 50a and 50b on the bottom side of the substrate 10 through the central through-holes 42a and 42b.

In such an arrangement, the second embodied example of the present invention can provide a common mode type four-terminal noise filter having electrically excellent characteristics from lower frequency band to higher frequency band.

As will be described later, experiments showed that the four-terminal noise filter provided an excellent attenuation in comparison with the prior art in which no shield conductor was provided.

FIG. 4 shows an equivalent circuit which may be used in the LC noise filter according to the second embodied example. The spirally formed inductor conductor 30a functions as a first inductor L1 while the other inductor conductor 30b acts as a second inductor L2.

Each of the capacitor conductors 50a and 50b on the bottom side of the substrate 10 defines a distributed constant capacitor together with the corresponding one of the inductor conductors 12a and 12b, without interruption of the magnetic path.

The terminals (16a and 18a; 16b and 18b) of each of the inductor conductors 12a and 12b are respectively used as input and output terminals while the terminals 52a and 52b of the respective capacitor conductors 50a and 50b are connected with ground to form a common mode type four-terminal noise filter having its electrically excellent characteristics.

Third Embodied Example

Figure 5:
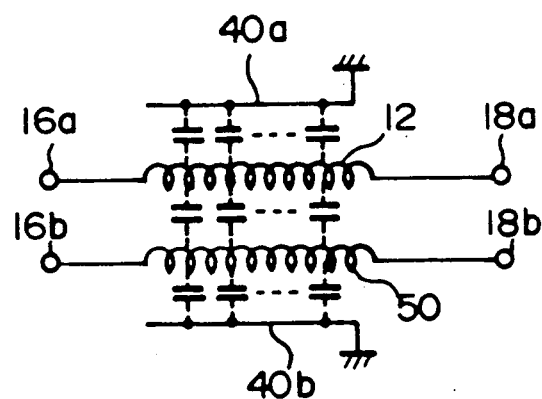

Referring now to FIG. 5, there is shown a third embodied example of the present invention, in which the LC noise filter comprises a shield conductor 40a located between each adjacent lines in a first conductor 12a and another shield conductor 40b similarly formed between each adjacent lines in a second conductor 50.

Each of the conductors 12 and 50 is connected at its opposite ends with input and output terminals to form a common mode type four-terminal noise filter.

Fourth Embodied Example

The inductance (L) and capacitance (C) of the LC noise filter according to the present invention can be set at any desired level by suitably selecting the material of the substrate 10 other than the number and layout of the first and second conductors 12 and 50.

If the inductance (L) is to be increased, the substrate 10 may be preferably made of a magnetic material. On the contrary, if the capacitance (C) is to be increased, the substrate 10 may be formed of a material having a higher dielectric constant, for example, such as ceramic. If both the inductance and capacitance are to be increased, the substrate 10 may be formed of both the aforementioned materials.

Alternatively, the inductance (L) may be increased by placing such a noise filter as in the first, second or third embodied example within a housing which forms a magnetic circuit.

Figure 6:
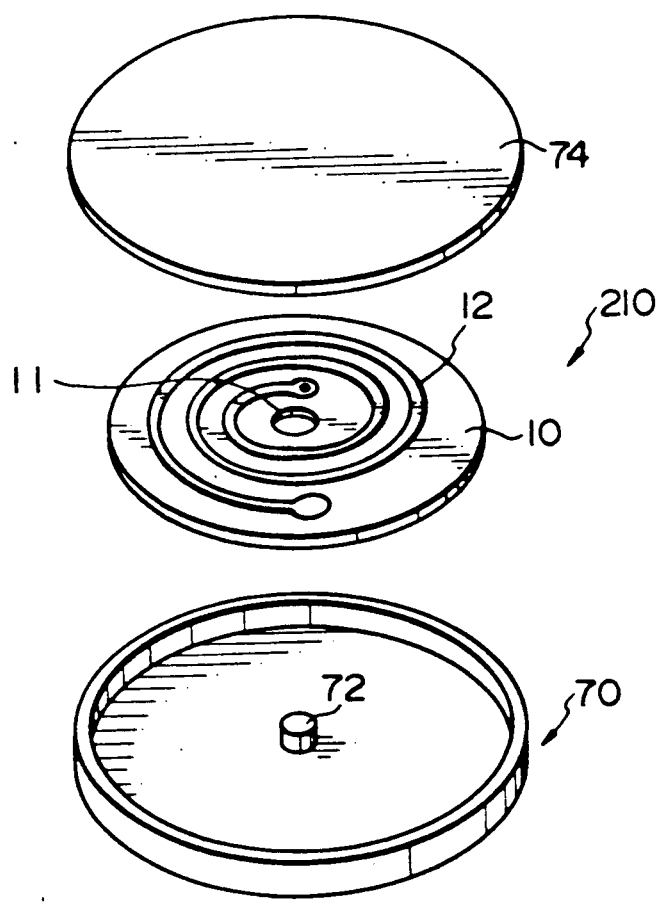

FIG. 6 shows such an arrangement in which the noise filter 210 shown in FIGS. 1-5 is placed within a housing 70 made of magnetic material.

The noise filter 210 comprises a substrate 10 including a core receiving aperture 11 formed therein substantially at the center thereof. The aperture 11 is adapted to receive a magnetic core 72 on the housing 70 at the central portion thereof. If a lid or closure means 74 is closed relative to the housing 70, there will be formed a magnetic closed path between the magnetic core 72 and the surrounding housing and lid (70 and 74). Therefore, the noise filter according to the fourth embodied example will be an LC noise filter having a sufficiently large inductance.

Although the fourth embodied example has been described as to the magnetic closed path provided by the use of the magnetic housing, the present invention is not limited to such a structure and may be applied to a magnetic open circuit, if necessary.

Concrete Examples of PC Board

As described in connection with the first–fourth embodied examples, the present invention provides a distributed constant type LC noise filter having an electrically excellent characteristics utilizing the opposite sides of the insulating substrate 10. If the insulating substrate 10 is formed of PC board, any number of distributed constant type LC noise filters may be provided on the PC board without an increase in the thickness of the PC board.

As a result, such a noise filter may be very preferably used for various types of electronic instruments which are increasingly being required to be reduced in size and weight. The PC board may be formed into a film or sheet configuration rather than the conventional substrates.

When such a distributed constant type LC noise filter is mounted, for example, in a lap-top type computer, the latter may be correspondingly reduced in size and weight.

In the past, any noise filter could not be mounted on PC boards for IC card (made of film-like substrates) from the limitation of required thickness in the PC boards. However, any number of LC noise filters constructed according to the present invention may be easily and simply mounted on a PC board.

Since the distributed constant type LC noise filter of the present invention can be formed only by printing wires on the PC board, PC boards for various type of applications may be utilized in the present invention without increase of the thickness thereof.

Figure 7:
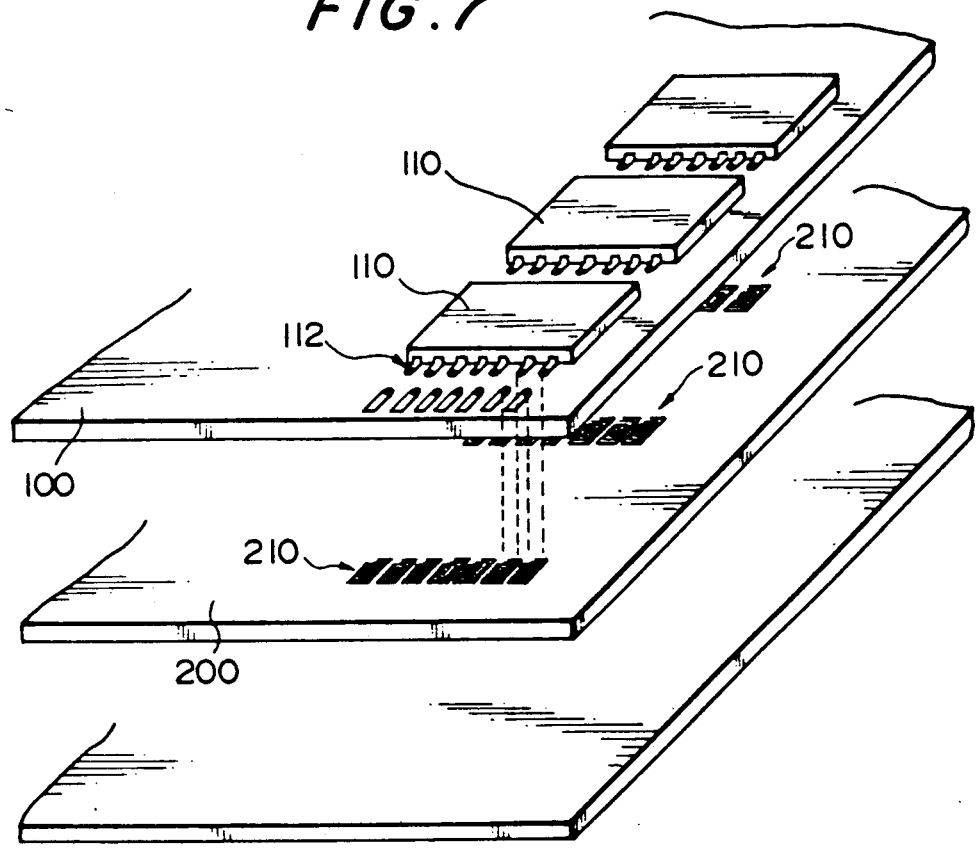

FIG. 7 shows a preferred example in which a multi-channel noise filter for signal lines is formed on a PC board. In this example, a plurality of integrated circuits 110 are mounted on the PC board 100 and connected with a substrate 100 through a plurality of signal lines 112.

A PC board 200 having a multi-channel noise filter is disposed below the PC board 100. The PC board 200 comprises a plurality of LC noise filters as in either of the first to fourth embodied examples, which are formed therein at positions opposite to input and output leads 112 in the respective integrated circuits 110. Thus, the PC board 200 will provide a multi-channel noise filter for signal lines 112 in the respective integrated circuits 110.

Such a multi-channel noise filter 210 may be simply and easily formed on the PC board 200 by printing or the like. A space occupied by the noise filter may be reduced for inductance and capacitance required therein.

Figure 8:
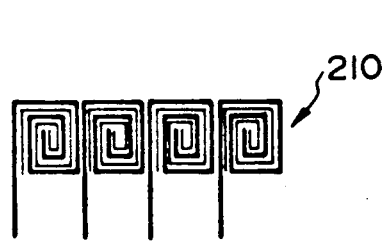
Figure 9:
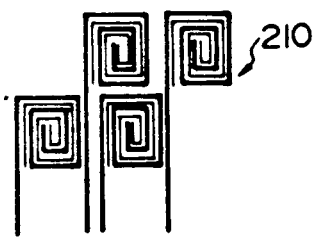

If the substrate 200 includes such a sufficient space as disposing the respective noise filters 210, they may be disposed close to one another, as shown in FIG. 8. If there is not sufficient space to be occupied by the noise filters 210, they may be alternately arranged, as shown in FIG. 9.

The PC board 200 so formed is disposed under the PC board 100 and electrically connected with the signal lines 112 on the PC board 100.

In such a manner, the multi-channel noise filter assembly may be formed on the board 200 without increase of the thickness thereof.

Although the multi-channel noise filter 210 has been described to be formed on the board 200 rather than the PC board 100 on which the integrated circuits 110 and the others have been provided, the multi-channel noise filter 210 may be alternatively formed on the PC board 100 if there is a sufficient space on the PC board 100 with the integrated circuits 110 thereon. In addition, power-line noise filters may be formed on the PC board 200.

Figure 10:
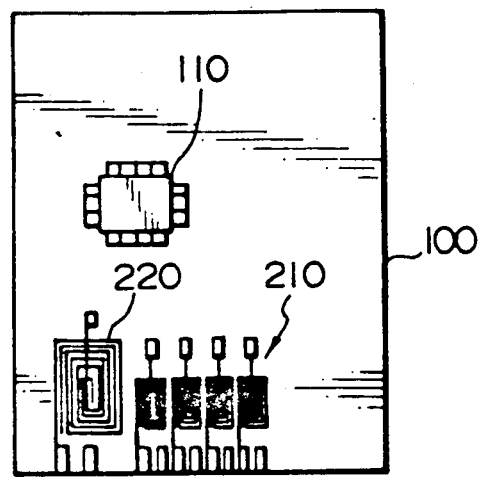

Referring now to FIG. 10, there is shown another arrangement according to the present invention, comprising a PC board 100 on which integrated circuits 110, a multi-channel noise filter assembly 210 for signal lines and a noise filter 220 for power line. Such a PC board 100 is very preferable for IC cards. If a plurality of integrated circuit 110 are disposed on the PC board, the power-line noise filter 220 may include channels equal to the number of the integrated circuits 110.

Particularly, in a case where a portable instrument having no grounded housing as in IC cards is used, it is preferable to utilize such a common mode type noise filter as shown in the second embodied example.

Figure 11:
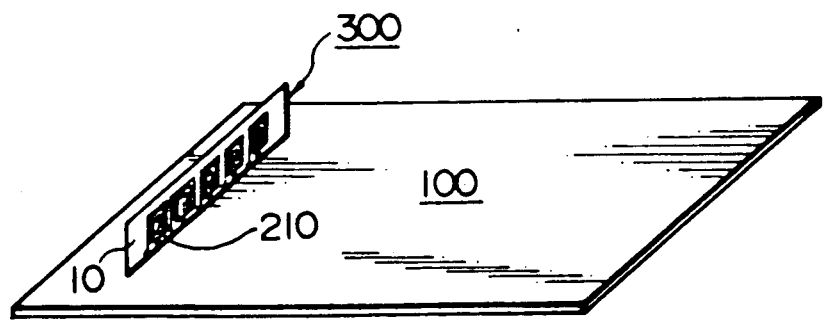

FIG. 11 illustrates a plurality of such noise filters as shown in either of the first–fourth embodied examples on a rectanguler insulating substrate 10 to form a multi-channel noise filter 300. Such a multi-channel noise filter 300 may be simply mounted on a PC board 100 as in the conventional electronic parts, and may be used for integrated circuits and other applications. The insulating substrate 10 may be of a film. The film-like substrate 10 may be placed on the PC board 100 horizontally rather than vertically as shown in FIG. 11. Thus, the multi-channel noise filter may be formed on the PC board 100 without increase of the thickness thereof.

Experimental Data

Experimental data will now be described in connection with distributed constant type noise filters constructed according to the principle of the present invention and noise filters constructed according to the prior art as shown in FIG. 17.

In the experiments, each insulating substrate 10 was a disc having a diameter equal to 14.5 mm and a thickness equal to 1.5 mm. The disc was made of a ceramic having a specific inductive capacity $\epsilon_H$ equal to 18.000 at 20° C.

Conductors placed on the insulating substrate 10, which are used, for example, to form the first conductor 12, the second conductor 50, the shield conductor 40 and others, were wires having a diameter equal to 0.6 mm.

The top and bottom sides of each of the insulating substrates 10 were respectively coated with conductive foils 410 and 420 to form a capacitor, as shown in FIG. 12 (A). This capacitor had a capacity of approximately 240 PF.

Figure 13:
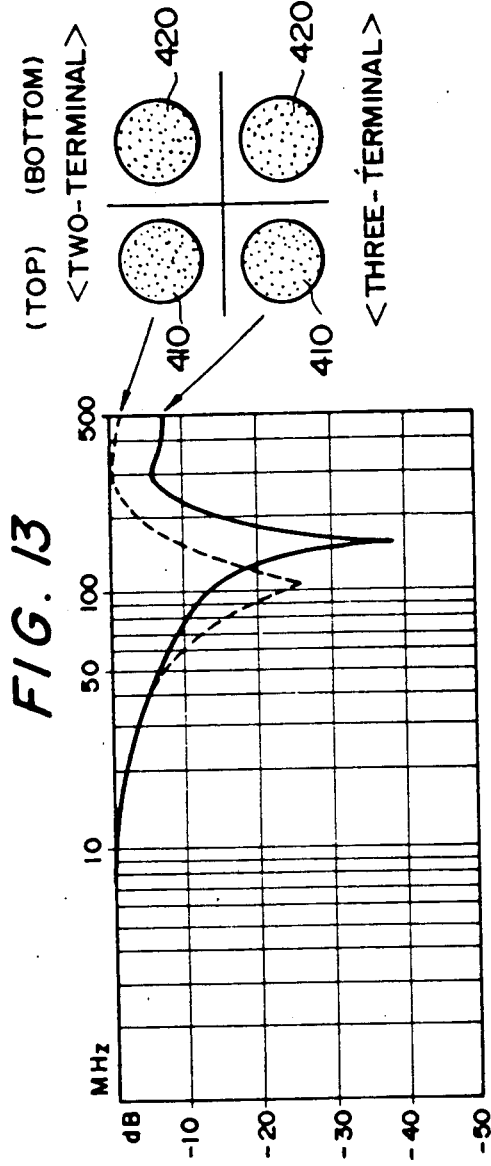
Figure 16:
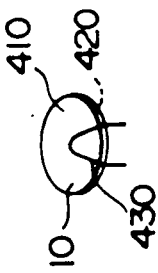

The attenuation of such a capacitor was measured by using it as a two-terminal noise filter and is shown by broken line in FIG. 13. As shown in FIG. 16, a U-shaped conductor 430 functioning as an inductor was placed on the capacitor type noise filter at one side. Such an assembly was then arranged to form a three-terminal LC noise filter and measured in respect to its attenuation. The results are shown by solid line in FIG. 13. When the inductance (L) in the conductor 430 was measured, it was equal to 0.0148 μH. This means that the noise filter did not function as an inductor very well but merely as a capacitor type noise filter. It has been thus found that such noise filters as shown in FIG. 12(A) have substantially the same attenuation in both the two-terminal and three-terminal types, as shown in FIG. 13.

Experiments were also carried out relating to assemblies in each of which a first conductor 12 and a shield conductor 40 are formed on an insulating substrate 10, as shown in FIG. 12(B) and (C). Each of the conductors had a width equal to 0.7 mm, a gap between each adjacent lines equal to 0.5 mm and a length equal to 140 mm. One of the substrates 10 was coated at its entire bottom face with a conductive foil 420 as shown in FIG. 12(B) and the other substrate 10 was coated at its bottom face with comb-like conductive foil 440 as shown in FIG. 12(C). The resulting noise filters were measured in respect to their attenuation. The noise filter as shown in FIG. 12(B) indicated such an attenuation as shown by broken line in FIG. 14 while the noise filter as shown in FIG. 12(C) showed such an attenuation as shown by solid line in FIG. 15.

Inductances in both the types of noise filter were equal to 0.172 μH and 0.178 μH, respectively. It has been found that they were improved, in respect to inductance in comparison with the noise filter shown in FIG. 12(A), but still have insufficient attenuation.

On the contrary, a noise filters in which first and second conductors 12 and 50 are spirally formed on the opposite sides of a substrate 10 at positions opposed to each other as shown in FIG. 12(D) showed to have its inductance equal to 0.2 μH. This improved attenuation is shown by broken line in FIG. 15.

A noise filter constructed according to the present invention as shown in FIG. 12(E) (corresponding to the first embodied example) showed to have an inductance equal to 0.20 μH. It has been found that this inductance provided an improved attenuation as shown by solid line in FIG. 15.

Figure 14:
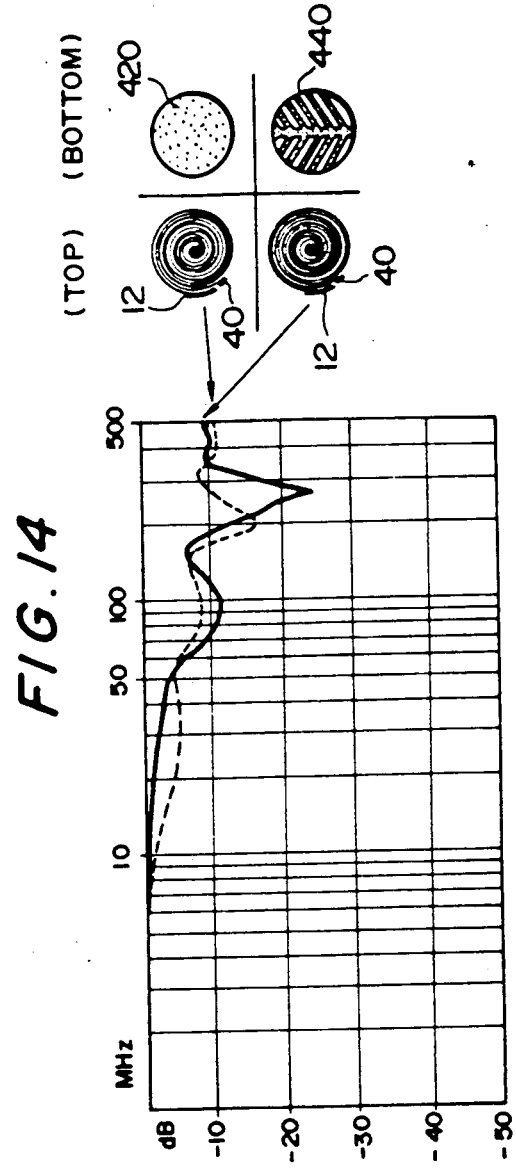
Figure 15:
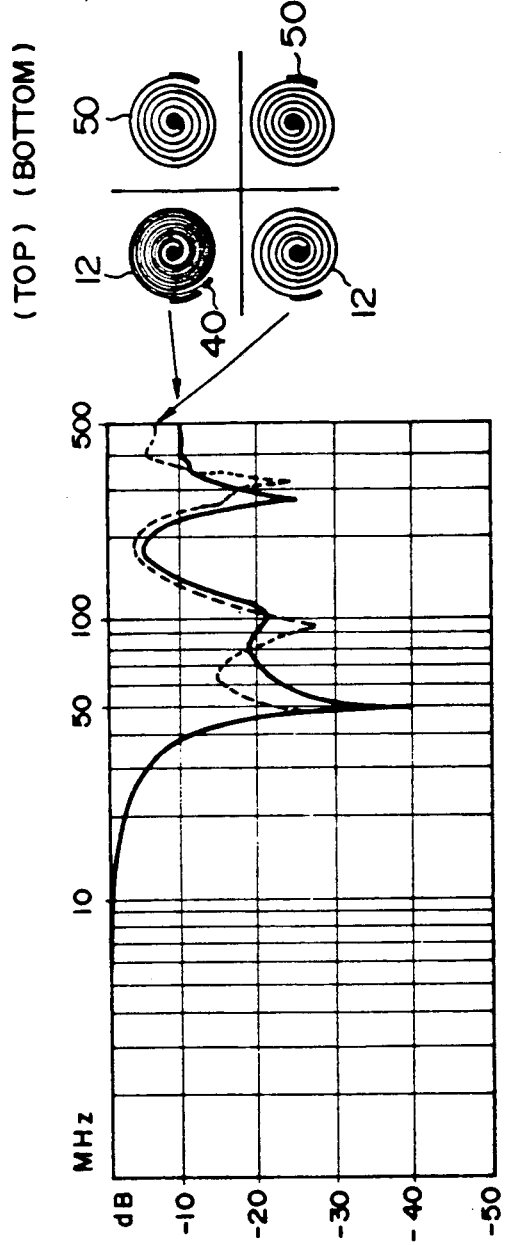

As will be apparent from the aforementioned experiments, the noise filter constructed according to the present invention has substantially the same inductance and capacitance as those of the prior art noise filters shown in FIGS. 13 and 14, but a very sharp and excellent attenuation due to lower frequency based on the inductance L.

The noise filter of the present invention shown in FIG. 12 (E) further shows that it can provide a sharp attenuation due to the inductance (L) higher than that of the noise filter shown in FIG. 12(D) in the presence of the shield conductor 40 on the substrate 10 between each adjacent lines in the first conductor 12.

Therefore, the noise filter constructed according to the principle of the present invention can be applied to a widened range of application from lower frequency to higher frequency.

The insulating substrate used in the noise filter of the present invention may be formed into film, sheet or any other suitable form.

If the substrate 10 is made of a high-frequency wave absorbing and heat generating material, noises included in signals passing through the conductor 12, particularly, high-frequency noises can be absorbed in the form of heat to improve the elimination of noises.

Second Embodiment

There will now be described a second preferred embodiment of the present invention in which an LC noise filter utilizes a cylindrical dielectric.

The LC noise filter comprises an insulating cylinder, a first conductor spirally formed on the inner or outer periphery of the cylinder to form an inductor, a second conductor spirally formed on the outer or inner periphery of the cylinder at a position opposite to the first conductor to form a capacitor between the first and second conductors, and a shield conductor located on the periphery of the cylinder between adjacent lines in at least one of the first and second conductors.

It is preferable that the first conductor is formed on the inner periphery of the cylinder and used for signal line or power line. It is also preferred that the second conductor is formed on the outer periphery of the cylinder. In such an arrangement, noises emitted from the signal or power line may be absorbed by the second conductor.

Some embodied examples obtained from the second embodiment of the present invention will now be described with reference to the corresponding figures in the drawings.

First Embodied Example

Figure 19B:
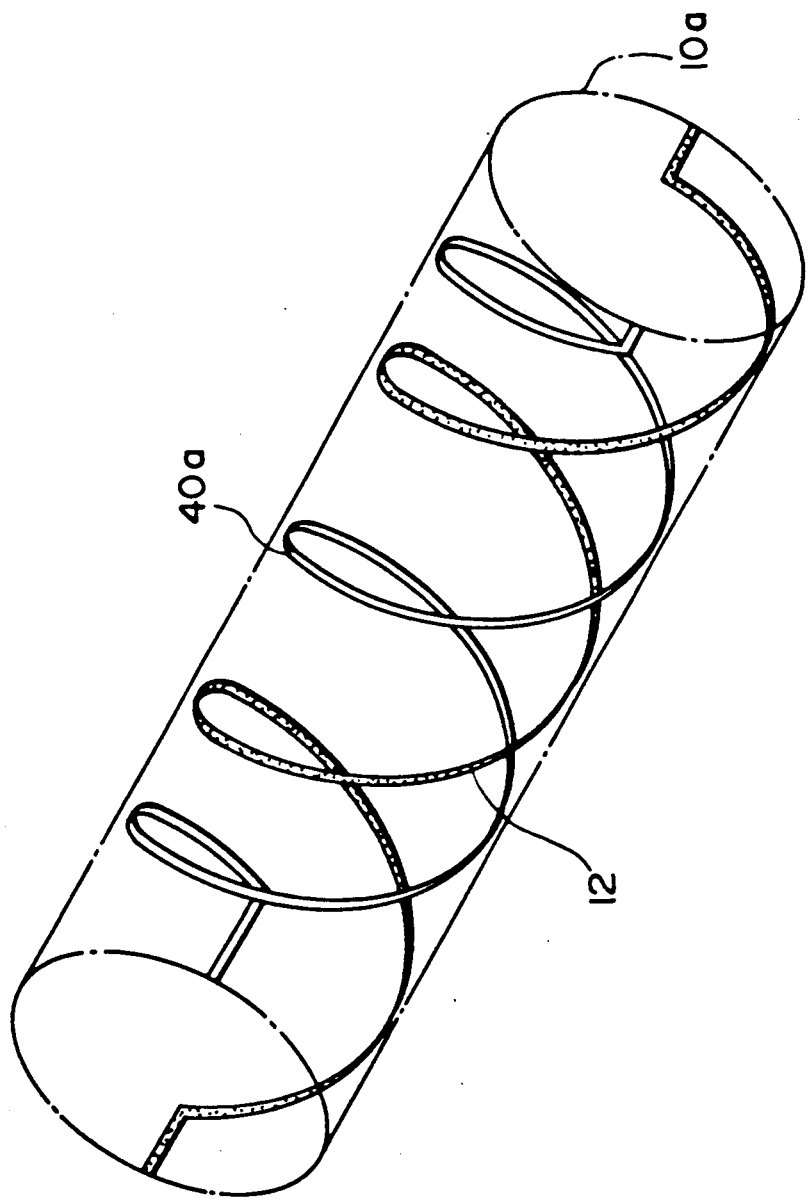

FIGS. 19A and 19B show a cylinder-shaped LC noise filter which is a first embodied example from the second embodiment of the present invention.

The cylinder-shaped LC noise filter comprises a cylinder 10 made of a ceramic material, a first conductor 12 spirally formed on the inner periphery 10a of the cylinder 10 and functioning as an inductor, and a second conductor 50 spirally formed on the outer periphery 10b of the cylinder 10 at a position opposite to the first conductor 12 to form a capacitor between the first and second conductors 12 and 50.

The first conductor 12 is electrically connected at its opposite ends with annular conductive layers 90a and 90b formed on the opened ends of the cylinder 10. The annular conductive layers 90a and 90b are connected with input and output leads 22a and 22b, respectively.

The second conductor 50 is connected at its opposite ends with leads 54a and 54b.

The first embodied example of the second embodiment is characterized by a shield conductor 40a that is spirally formed on the cylinder 10 between each adjacent lines in the first conductor 12 on the inner wall 10a of the cylinder 10, as shown in FIG. 19B. The shield conductor 40a is electrically connected at one end with a conductive layer 90c which is formed on the cylinder 10 at the end face thereof.

As shown in FIG. 19A, the noise filter further includes a shield conductor 40b which is spirally formed on the outer wall of the cylinder 10 between each adjacent lines in the second conductor 50. The shield conductor 40b is similarly connected at one end with the conductive layer 90c which in turn is connected with a ground lead 44.

FIG. 5 shows an equivalent circuit which may be used in the cylinder-shaped LC noise filter. In the first embodied example, the first spirally formed conductor 12 functions as a first inductor L1. Since the first and second conductors 12 and 50 are arranged on the inner and outer walls of the cylinder 10 at positions opposite to each other, they will be electrostatically capacitive-coupled with each other to form a distributed constant capacitor C therebetween.

The second spirally formed conductor 50 also functions as a second inductor L2.

Thus, the first embodied example of the second embodiment will provides a distributed constant type LC noise filter having such an equivalent circuit as shown in FIG. 5.

If at least one of the input and output leads 54a or 54b in the second conductor 50 is connected with a ground terminal and if the input and output leads 22a and 22b of the first conductor 12 are respectively connected with input and output terminals, the noise filter can be used as a normal mode type noise filter having an improved electrical performance.

If the input and output leads 22a, 22b and 54a, 54b of the first and second conductors 12 and 50 are respectively used as input and output terminals, the noise filter according to the first embodied example can be used as a common mode type four-terminal noise filter having an improved electrical performance.

The noise filter constructed according to the first embodied example of the second embodiment can function as a noise filter having its electrical excellent characteristics from lower frequency to higher frequency since each of the shield conductors 40a or 40b electrically shields between adjacent lines in the first or second conductor 12 or 50 to prevent a short-circuit therebetween. This means that the noise filter can be more preferably used as a common mode type noise filter.

If the noise filter of the first embodied example is used as a normal mode type noise filter, only the shield conductor 40a is sufficient to prevent a short-circuit in the first conductor 50 without need of the second shield conductor 40b for the second conductor 50.

Since the first conductor 12 to be connected with a signal or power line is formed on the inner wall of the cylinder 10 while the second conductor 50 used as a ground conductor is formed on the outer wall of the cylinder 10, noises emitted from the first conductor 12 when signal or power current flows therein can be absorbed by the second conductor 50 to interrupt the noises emitted from the cylinder 10 resulting in a very reduced level.

The noise filter according to the first embodied example may be formed as a distributed constant circuit in which the inductance (L) and capacitance (C) are unevenly distributed. This may cause noise components to be more effectively eliminated without creation of any strain in signals, depending on the type of signal.

Figure 20:
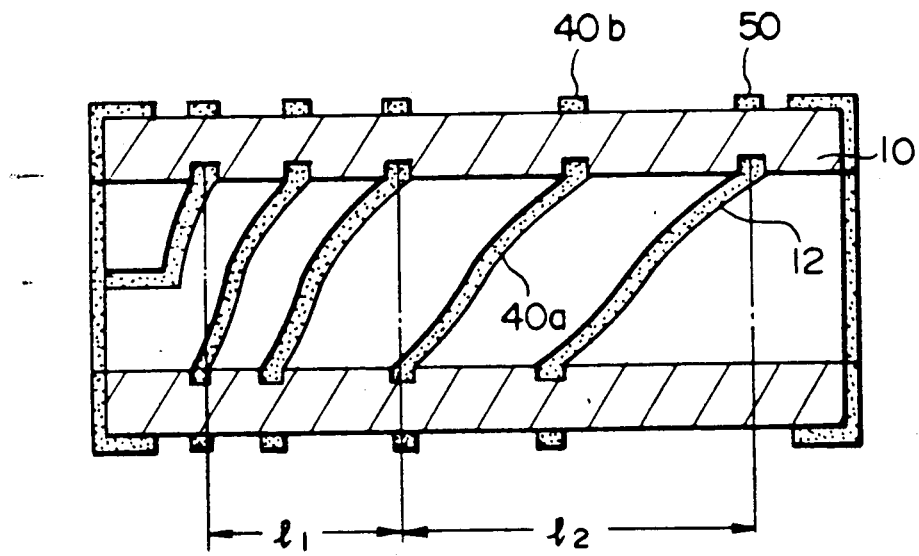
Figure 21:
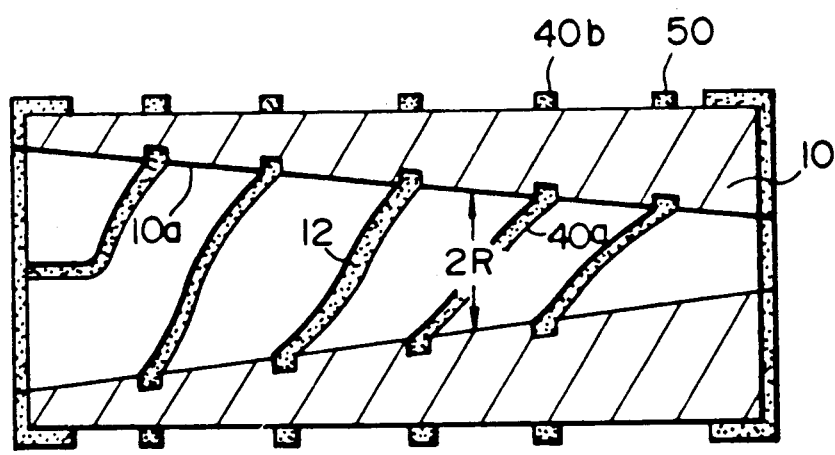

As shown in FIG. 20, the noise filter having such a distributed constant circuit may be formed by varying the pitches $l_1$ and $l_2$ in the first spirally formed conductor 12. Furthermore, the noise filter may be formed by sequentially varying the diameter 2R in the inner wall 10a of the cylinder 10, as shown in FIG. 21.

Although the noise filter has been described as to the first conductor 12 connected at its opposite ends with the conductive layers 90a and 90b adjacent to the opposite opened ends of the cylinder 10 and connected with the input and output leads 22a and 22b, the present invention is not limited to such an arrangement and may be formed by connecting the opposite ends of the first spirally formed conductor 12 directly with the input and outer leads 22a and 22b, respectively.

Second Embodied Example

FIGS. 22A and 22B show the second embodied example of the second embodiment according to the present invention.

As seen from FIGS. 22A and 22B, a cylinder-shaped LC noise filter according to the second embodied example comprises a cylinder 10, a pair of first or inductor conductors 12a and 12b spirally formed on the inner wall 10a of the cylinder 10 and a pair of second or capacitor conductors 50a and 50b spirally formed on the outer wall 10b of the cylinder 10 at positions opposite to the respective inductor conductors 12a and 12b.

Each of the inductor conductors 12a and 12b spirally formed adjacent to each other is connected at its opposite ends with conductive layers 90a, 92a or 90b, 92b formed on the cylinder 10 at the opposite opened ends thereof.

The conductive layers 90a, 92a and 90b, 92b are connected with input and output leads 22a, 24a and 22b, 24b, respectively.

As shown in FIG. 22A, each of the capacitor conductors 50a or 50b is electrically connected at one end with the other capacitor conductor 50b or 50a, the connection of the capacitor conductors 50a and 50b being in turn connected with a ground lead 54a.

In the cylinder-shaped LC noise filter of the second embodied example, as seen from the equivalent circuit of FIG. 4, the spirally formed inductor conductor 12a functions as a first inductor L1 while the spirally formed inductor conductor L2 acts as a second inductor L2. Therefore, the noise filter will be of a common mode type cylindrical LC noise filter.

According to the second embodied example, the noise filter shown in FIGS. 22A and 22B is characterized by that it comprises a first shield conductor 40a-1 spirally formed on the cylinder between the inductor conductors 12a and 12b, shown in FIG. 22A, and a second shield conductor 40a-2 similarly formed between the inductor conductors 12b and 12a, as shown in FIG. 22B. These shield conductors 40a-1 and 40a-2 provide an electric shield between the inductor conductors 12a and 12b.

Each of the conductors 40a-1 and 40a-2 is connected at one end with a ground lead 44 through a conductive layer 90c which is formed on the end of the cylinder 10.

In such a manner, the present invention provides a common mode type noise filter having an electrical excellent performance from lower frequency to higher frequency.

Third Embodied Example

The cylinder-shaped LC noise filter of the present invention may have its inductance (L) and capacitance (C) set at any suitable level by suitably selecting the material of the cylinder 10 other than the number of turns and layout in the first and second conductors 12 and 50.

For example, if the inductance (L) is to be increased, the cylinder 10 may be formed of any suitable magnetic material or dipped with magnetic powder. If the capacitance (C) is to be increased, the cylinder 10 may be made of a material having its increased dielectric constant, such as ceramic. If both the inductance and capacitance are to be increased, the cylinder 10 may be formed of a combination of the magnetic material with the material having the increased dielectric constant.

If the inductance (L) is desired to be higher, the cylinder may be filled with a magnetic material.

Figure 23:
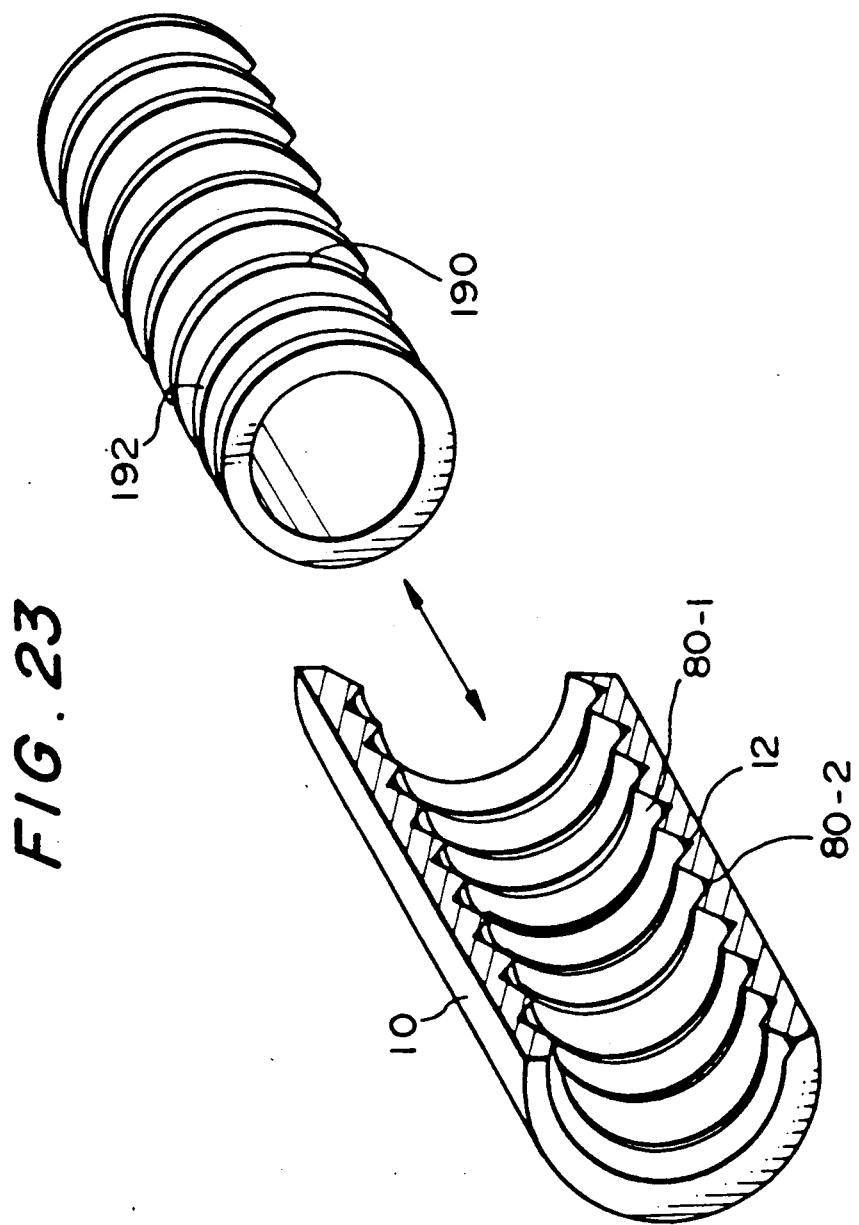

FIG. 23 shows a preferably embodied example of the second embodiment which is constructed in view of the above matter. The noise filter comprises a cylinder 10 including a pair of thread grooves 80-1 and 80-2 spirally formed on the inner wall 10a of the cylinder 10. Each of the thread grooves 80-1 and 80-2 is covered with a first or shield conductor 12 or 40 which is spirally formed therein.

A second conductor 50 (not shown) is spirally formed on the outer wall of the cylinder 10 at a position opposite to the first conductor 12.

The cylinder 10 is adapted to threadingly receiving a screw 190 therein with the thread 192 of the screw 190 being engaged by the thread grooves. The thread 192 includes a flat top which will not be brought into contact with the first and shield conductors 12 and 40 in the bottom of the thread groove when the screw 190 is received into the cylinder 10. In this connection, the screw 190 is characterized by that it is made of a magnetic material.

By adjusting the amount of the screw 190 into or out of the cylinder 10, thus, the inductances L1 and L2 of the first and second conductors 12 and 50 may be regulated into their desired levels.

Other Embodied Examples

The present invention is not limited to the previously described embodiments thereof and may be applied in various modifications within the range of invention defined in the appendant claims.

For example, the second and third embodied examples of the second embodiment may be formed into a noise filter having its unevenly distributed constant circuit, as in the first embodied example of the second embodiment. In such a case, the first spirally formed conductor 12 may be changed in pitch, as shown in FIG. 20. Alternatively, the diameter 2R in the inner wall 10a of the cylinder 10 may be varied to provide such an unvenly distributed constant circuit.

In the second and third embodied examples of the second embodiment, the first conductor 12 may be connected at its opposite ends directly with the input and output leads 22a and 22b without any conductive layer.

Although the respective embodied examples of the second embodiment have been described as to the first conductor 12 formed on the inner wall 10a of the cylinder 10, the first conductor 12 may be formed on the outer wall 10b of the cylinder 10 while the second conductor 50 may be formed on the inner wall of the same cylinder 10, if desired.

It is also preferred that the first and second conductors 12 and 50 are respectively formed on the inner and outer walls of the cylinder 10 by dipping. However, the first conductor 12 may be in the form of a spirally precoiled wire while the second conductor 50 may be in the form of a cylindrically or spirally formed conductive sheet or wire.

The cylinder-shaped LC noise filter constructed according to the present invention may be used not only as a high-frequency noise filter for signal line, but also as a low-frequency noise filter for power line. If the LC noise filter is used as a high-frequency noise filter, it is preferred to set its inductance and capacitance at a relatively low level. If it is used as a low-frequency noise filter, it is preferred to set its inductance and capacitance at a relatively high level.

When the noise filter of the present invention is used to eliminate high-frequency noises, the latter may be effectively removed without distortion in signals since the inductance and capacitance are in the form of distributed constant.

If the cylinder 10 is made of high-frequency heat absorbing material, noises and particularly high-frequency noise components emitted from signals passing through the conductor 12 may be absorbed in the form of heat. Thus, the noises can be eliminated more effectively.

Although the substrate 10 has been described as to be formed into a cylinder, it may be formed into any other suitable configuration.

Figure 24:
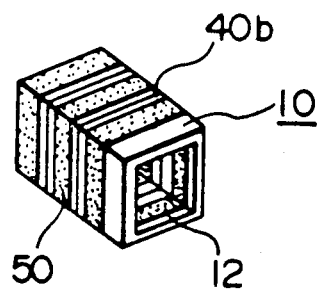

If the substrate 10 is formed into a square column as shown in FIG. 24, the noise filter of the present invention may be used as an SMD type electronic part.

Figure 25:
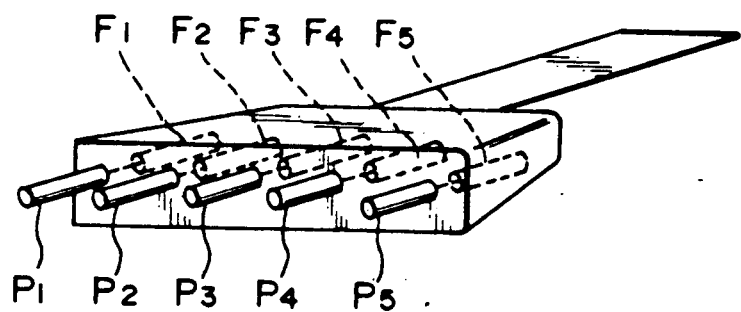

As shown in FIG. 25, noise filters constructed according to the present invention may be connected with a multi-channel type plug or a multi-channel socket (not shown). In such a manner, a multi-channel type noise filter assembly can be provided simply and easily. In this case, noise filters denoted $F_1, F_2, \ldots F_5$ are placed within the multi-channel type plug such that they are respectively connected with pins $P_1, P_2, \ldots P_5$ previously provided in the multi-channel type plug.

What is claimed is:

1. A distributed constant type LC noise filter comprising a dielectric; a first conductor spirally formed on a first surface of said dielectric, said first conductor being adapted to function as an inductor; a second conductor spirally formed on a second surface of said dielectric at a location opposite to said first conductor to provide a distributed constant type capacitor between said first and second conductors; and shield conductor means spirally formed on said dielectric between spirally formed adjacent lines of said first conductor and adapted to prevent a short-circuit between said spirally formed adjacent lines.

2. A distributed constant type LC noise filter as defined in claim 1 wherein said dielectric is an insulating substrate.

3. A distributed constant type LC noise filter as defined in claim 2 wherein said filter is formed to be of a normal mode type by respectively connecting a first and a second end of said first conductor with input and output terminals and by connecting a first end of said second conductor with a ground terminal.

4. A distributed constant type LC noise filter as defined in claim 3 wherein a second end of said second conductor is electrically connected with a first end of said shield conductor means through a hole formed through said substrate.

5. A distributed constant type LC noise filter as defined in claim 2 wherein a first end of each of said first and second conductors are respectively connected with an input terminal and a second end of each of said first and second conductors are respectively connected with an output terminal to form a common mode type LC noise filter.

6. A distributed constant type LC noise filter as defined in claim 2 wherein said first conductor includes a pair of inductor conductors spirally formed on said first surface of said substrate adjacent to each other and said second conductor includes a pair of capacitor conductors spirally formed on said second surface of said substrate at positions opposite to the respective inductor conductors to form a capacitor between each of said capacitor conductors and the corresponding inductor conductor, the opposite ends of each of said inductor conductors being respectively connected with the input and output terminals to form a common mode type filter.

7. A distributed constant type LC noise filter as defined in claim 6 wherein said shield conductor means is located between adjacent lines in said inductor conductors to prevent a short-circuit between each adjacent inductor conductors.

8. A distributed constant type LC noise filter as defined in claim 2 wherein a plurality of said first conductors are formed on said first surface of said insulating substrate, a plurality of said second conductors being formed on said second surface of said insulating substrate at positions opposite to the respective first conductors, and said shield conductor means being located between adjacent lines in each of said spirally formed first conductors, whereby said LC noise filter can be formed as a multi-channel noise filter for signal lines.

9. A distributed constant type LC noise filter as defined in claim 2 wherein said insulating substrate includes a magnetic-core receiving aperture formed therein substantially at the center thereof and further comprising a magnetic housing having one opened end and receiving said insulating substrate, a magnetic core extending through said magnetic-core receiving aperture to form a magnetic path between said magnetic core and said magnetic housing, and closure means of magnetic material covering the opened end of said magnetic housing to form a magnetic path between said magnetic housing and said magnetic core, whereby a magnetic closed path can be formed between said first and second conductors.

10. A distributed constant type LC noise filter as defined in claim 1 wherein said dielectric is formed into an insulating cylinder, said first conductor being spirally formed on said cylinder at one of the inner and outer periphery thereof, said second conductor being spirally formed on the other of the outer and inner periphery of said cylinder at a location opposite to said first conductor, said shield conductor means being formed on a same side of said cylinder as said first conductor and being positioned between adjacent lines in said first conductor to prevent a short-circuit therebetween.

11. A distributed constant type LC noise filter as defined in claim 10 wherein a first end and a second end of said first conductor are respectively connected with input and output terminals and a first end of said second conductor is connected with ground, whereby said noise filter can be formed to be of a normal mode type.

12. A distributed constant type LC noise filter as defined in claim 10 wherein a first end of each of said first and second conductors is connected with an input terminal and a second end of each of said first and second conductors is connected with an output terminal whereby said noise filter can be formed into a common mode type noise filter.

13. A distributed constant type LC noise filter as defined in claim 10 wherein said first conductor includes at least a pair of inductor conductors spirally formed on one of the inner and outer periphery of said cylinder adjacent to each other and said second conductor includes at least a pair of capacitor conductors each of which is spirally formed on the other periphery of said cylinder at a location opposite to the corresponding one of said inductor conductors to form a capacitor therebetween, each of said inductor conductors being respectively connected at said first end and said second end with the input and output terminals to form a common mode type noise filter.

14. A distributed constant type LC noise filter as defined in claim 13 wherein said shield conductor means is paired with each of said inductor conductors and lies between adjacent lines thereof to prevent a short-circuit between said adjacent lines in each of said inductor conductors.

15. A distributed constant type LC noise filter as defined in claim 14, further comprising another shield conductor means located on the other side of said cylinder between each adjacent lines in each of said capacitor conductors to prevent a short-circuit therebetween.

16. A distributed constant type LC noise filter as defined in claim 10 wherein a spacing between the spiral sections in each of said first conductors is varied to provide an uneven inductance and capacitance distribution.

17. A distributed constant type LC noise filter as defined in claim 10 wherein said cylinder has a hollow portion filled with a magnetic material.

18. A distributed constant type LC noise filter as defined in claim 17 wherein said cylinder includes thread means formed therein on the inner wall thereof, said magnetic material being formed into a screw configuration such that it can be threadedly engaged by said thread means to adjust the length of said magnetic material entering the hollow portion of said cylinder, whereby the inductance can be regulated by moving the screw-shaped magnetic material into and out of the hollow portion of said cylinder.

19. A distributed constant type LC noise filter as defined in claim 10 wherein said second conductor is formed on said cylinder at its outer periphery and wherein said first conductor is formed on said cylinder at its inner periphery.

20. A distributed constant type LC noise filter as defined in claim 1 wherein said dielectric is made of a material generating heat by absorbing electromagnetic waves.

21. A distributed constant type LC noise filter as defined in claim 2, further comprising a second shield conductor means spirally formed on said second surface of said dielectric between spirally formed adjacent lines of said second conductor.

* * * * *